(12) United States Patent
Chien et al.

(10) Patent No.: US 9,276,090 B2
(45) Date of Patent: Mar. 1, 2016

(54) SELF-RECTIFIED DEVICE, METHOD FOR MANUFACTURING THE SAME, AND APPLICATIONS OF THE SAME

(71) Applicant: MACRONIX INTERNATIONAL CO., LTD., Hsinchu (TW)

(72) Inventors: Wei-Chih Chien, New Taipei (TW);
Dai-Ying Lee, Hsinchu County (TW);
Erh-Kun Lai, Taichung (TW);
Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 146 days.

(21) Appl. No.: 13/928,543

(22) Filed: Jun. 27, 2013

(65) Prior Publication Data

US 2014/0203237 A1    Jul. 24, 2014

Related U.S. Application Data

(60) Provisional application No. 61/753,981, filed on Jan. 18, 2013.

(51) Int. Cl.
*H01L 27/24* (2006.01)
*H01L 29/66* (2006.01)
*H01L 45/00* (2006.01)
*H01L 29/861* (2006.01)
*E04H 17/16* (2006.01)

(52) U.S. Cl.
CPC .......... *H01L 29/66969* (2013.01); *E04H 17/16* (2013.01); *H01L 29/8615* (2013.01); *H01L 45/145* (2013.01); *H01L 45/1608* (2013.01)

(58) Field of Classification Search
CPC ....... H01L 45/04; H01L 27/24; H01L 45/144; H01L 45/1233; H01L 45/06
USPC ......................................................... 257/1–6
See application file for complete search history.

(56) References Cited

U.S. PATENT DOCUMENTS

| | | | | |
|---|---|---|---|---|
| 2007/0184613 A1* | 8/2007 | Kim | ................... | G11C 13/0004 438/257 |
| 2010/0105165 A1* | 4/2010 | Ho | ...................... | H01L 45/1273 438/104 |
| 2010/0112810 A1* | 5/2010 | Lee | ......................... | H01L 45/04 438/666 |
| 2010/0283028 A1* | 11/2010 | Brubaker | ............. | H01L 27/2409 257/2 |
| 2011/0147696 A1* | 6/2011 | Lee | ..................... | G11C 13/0007 257/4 |
| 2012/0002457 A1* | 1/2012 | Kanda | .................. | G11C 7/1021 365/148 |
| 2013/0221315 A1* | 8/2013 | Wang | ...................... | H01L 45/08 257/4 |

* cited by examiner

*Primary Examiner* — Allen Parker
*Assistant Examiner* — Didarul Mazumder
(74) *Attorney, Agent, or Firm* — McClure, Qualey & Rodack, LLP

(57) ABSTRACT

A self-rectified device is provided, comprising a bottom electrode, a patterned dielectric layer with a contact hole formed on the bottom electrode, a memory formed at the bottom electrode and substantially aligned with the contact hole, and a top electrode formed on the bottom electrode and filling into the contact hole to contact with the memory, wherein the top electrode comprises a N+ type semiconductor material or a P+ type semiconductor material, and the memory and the top electrode produce a self-rectified property.

23 Claims, 13 Drawing Sheets

SELF-RECTIFIED DEVICE, METHOD FOR MANUFACTURING THE SAME, AND APPLICATIONS OF THE SAME

CROSS-REFERENCE TO RELATED APPLICATIONS

This application claims the benefit of U.S. provisional application Ser. No. 61/753,981, filed Jan. 18, 2013, the subject matter of which is incorporated herein by reference.

BACKGROUND

1. Field of the Invention

The disclosure relates in general to a memory device, a method for manufacturing the same and application of the same, more particularly to a self-rectified device, a method for manufacturing the same, a three-dimensional structure applying with the same and a reading method of a 3D memory device having self-rectified memory cells.

2. Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable thin-film transistor (TFT) NAND-type flash memory structures have been proposed.

Resistive random-access memory (RRAM or ReRAM) is a non-volatile memory type. Resistive memories attract much attention due to its simple MIM (Metal-Insulator-Metal) structure and promising scalability. Different forms of ReRAM have been disclosed, based on different dielectric materials, spanning from perovskites to transition metal oxides to chalcogenides.

Resistive memory device, as the example of the transition metal oxide memory (transition metal oxide resistive memory (TMO ReRAM), and etc.) is a group of two-terminal memory devices that stores the data by different resistance levels. Take a typical ReRAM device with a $WSi_xO_y$ memory and a TiN top electrode for example, hereinafter $TiN/WSi_3O_y$ device. FIG. 1 shows a DC bipolar operation of the typical $TiN/WSi_xO_y$ device. The typical $TiN/WSi_xO_y$ device shows very high initial resistance indicating good and uniform oxidation. An initial negative forming voltage is required to bring a high resistance state (HRS) to a low resistance state (LRS). In FIG. 1, the SET state is reached after forming by a negative voltage. Then the cell can be switched in bipolar mode with positive voltage for the RESET state, and negative voltage for the SET state. FIG. 2 shows an AC operation of the typical $TiN/WSi_xO_y$ device. The cell can be switched in bipolar operation like DC switching. The typical $TiN/WSi_xO_y$ device can be reset by applying a positive pulse (to reach the RESET state), and set by applying a negative pulse (to reach the SET state), similar to WOx ReRAM.

FIG. 3 shows the cycling tests with verification of the typical $TiN/WSi_xO_y$ device, and the device being cycled more than 30K times with 10×HRS/LRS ratio. In the cycling tests, the cycling endurance of the typical $TiN/WSi_xO_y$ device is more than 30K times, and 10× resistance window is well maintained by the usual program-verifying algorithm. The $TiN/WSi_xO_y$ ReRAM presents the typical ReRAM property similar to the conventional bipolar ReRAM. When an array with the typical $TiN/WSi_xO_y$ ReRAM is constructed, transistors should be included in the array structure, and each of the transistors functions as the switch of the memory cell.

Additionally, since NAND Flash can stack up vertically with many layers, two-dimensional (2D) ReRAM has little advantage in cost. Three-dimensional (3D) stacking of ReRAM turns out very challenging since (1) the lack of good bipolar selecting device, and (2) the difficulty of decoding a 3D array of 2-terminal devices. Thus, it is also desirable to develop and realize a 2D cross point array and a 3D ReRAM with excellent electrical properties, such as a self-rectifying property, and the reliability and stability of data storage.

SUMMARY

The disclosure relates to a self-rectified device and a method for manufacturing the same. The self-rectified behavior of the device is applicable to a two-dimensional (2D) cross point array and a three-dimensional ReRAM structure, which are illustrated in the related embodiments. The simple method for manufacturing the self-rectified device of the embodiment allows it to incorporate into a double-density 3D architecture that adopts a regular MOSFET for X-Y decoding. A reading method of a 3D memory device having self-rectified memory cells is also illustrated in the embodiment.

According to the embodiment, a self-rectified device is provided, comprising a bottom electrode; a patterned dielectric layer with a contact hole formed on the bottom electrode; a memory formed at the bottom electrode and substantially aligned with the contact hole; and a top electrode formed on the bottom electrode and filling into the contact hole to contact the memory, and the top electrode comprising N+ type or P+ type semiconductor material, wherein the memory and the top electrode produce a self-rectified property.

According to the embodiment, a method for manufacturing a self-rectified device is disclosed, comprising: forming a bottom electrode; forming a patterned dielectric layer on the bottom electrode, and the patterned dielectric layer having a contact hole exposing the bottom electrode; forming a memory at the bottom electrode, and the memory substantially aligned with the contact hole; and forming a top electrode on the bottom electrode and filling into the contact hole to contact the memory, and the top electrode comprising N+ type or P+ type semiconductor material, wherein the memory and the top electrode produce a self-rectified property.

According to the embodiment, one of the three-dimensional (3D) resistive memory structures is provided, comprising a plurality of word lines arranged substantially in parallel; a plurality of bit lines arranged substantially in parallel, and the bit lines substantially perpendicular to the word lines; a plurality of electrodes arranged in parallel and extended in a vertical direction to the bit lines and the word lines, and the electrodes electrically connected to the bit lines and the word lines correspondingly; and a plurality of memory devices, and each of the memory devices formed on each sidewall of the electrodes, resulting in two memory devices of each self-rectified cell. Also, the electrode comprises an N+ type or a P+ type semiconductor material, and a self-rectifying property is produced by the contact between the memory devices and the electrode.

According to the embodiment, A method of reading a memory cell of a 3D memory device is provided, comprising: applying a voltage to a selected electrode; grounding a selected layer which is perpendicular to the selected electrode; applying one third of the voltage to unelected layers; and sensing the memory cell located in a crossover of the selected electrode and the selected layer.

The disclosure will become apparent from the following detailed description of the preferred but non-limiting embodiments. The following description is made with reference to the accompanying drawings.

DETAILED DESCRIPTION

The embodiments of the present disclosure disclosed below are for elaborating a self-rectified device and a method for manufacturing the same. The self-rectified behavior of the device is applicable to a two-dimensional (2D) cross point array and a three-dimensional ReRAM structure, which are illustrated in the related embodiments. A 3D architecture is also provided by incorporating the self-rectified device of the embodiment. Also, a reading method of a 3D memory device having self-rectified memory cells is also illustrated in the embodiment.

Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments.

Figure 1:
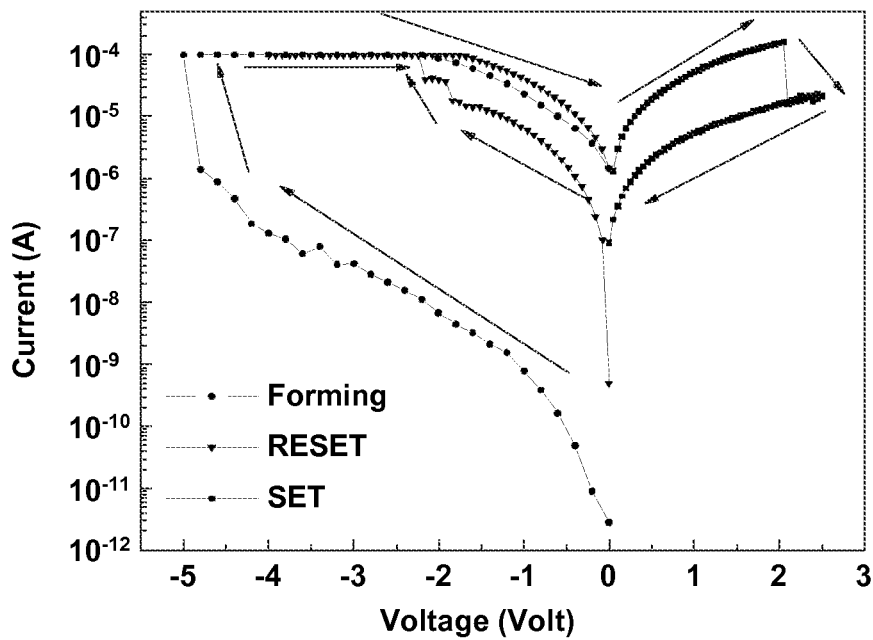
FIG. 1 shows a DC bipolar operation of the typical TiN/WSi$_x$O$_y$ device.
Figure 2:
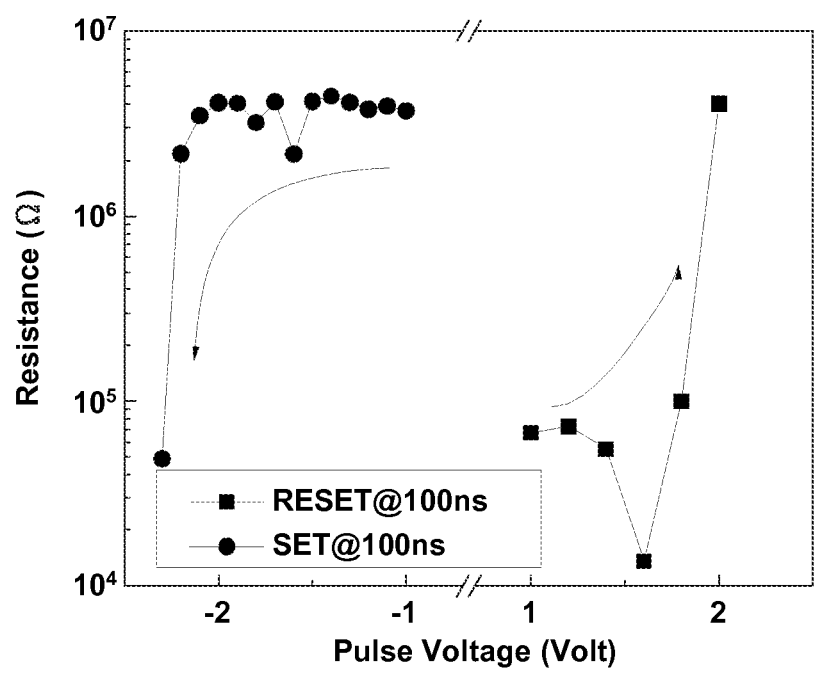
FIG. 2 shows an AC operation of the typical TiN/WSi$_x$O$_y$ device.
Figure 3:
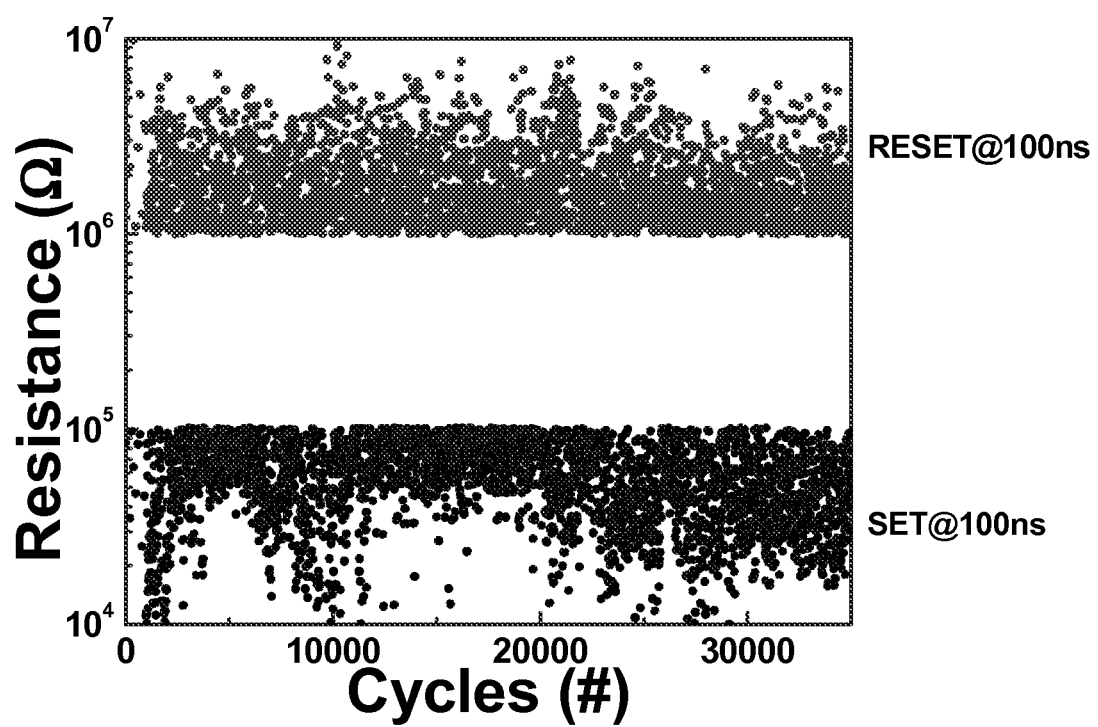
FIG. 3 shows the cycling tests with verification of the typical TiN/WSi$_x$O$_y$ device, and the device being cycled more than 30K times with 10×HRS/LRS ratio.
Figure 4:
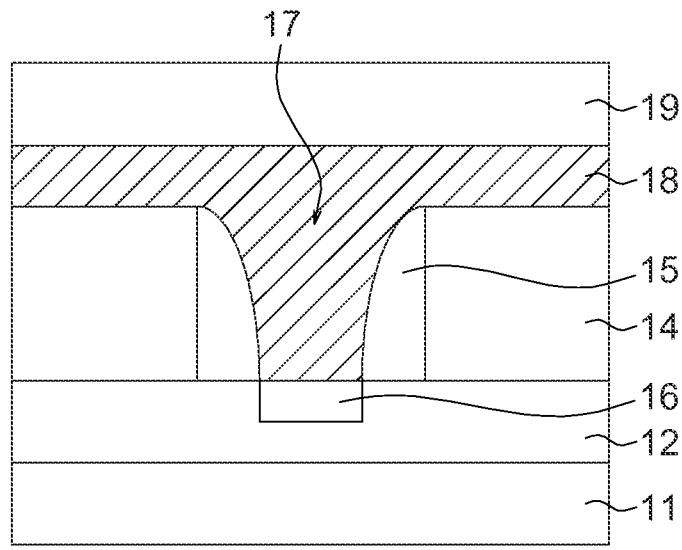
FIG. 4 illustrates a self-rectified device according to the embodiment of the disclosure.

FIG. 4 illustrates a self-rectified device according to the embodiment of the disclosure. As shown in FIG. 4, a self-rectified device 1 comprises a bottom electrode 12, a patterned dielectric layer 14 with a contact hole 17 formed on the bottom electrode 12, a memory 16 formed at the bottom electrode 12 and substantially aligned with the contact hole 17, and a top electrode 18 formed on the bottom electrode 12 and filling into the contact hole 17 to contact the memory 16. Also, the patterned dielectric layer 14 may comprise a spacer 15 positioned besides the contact hole 17, and the memory 16 is aligned with the contact hole 17 and the spacer 15. According to the embodiments of the disclosure, the memory 16 comprises an N+ type semiconductor material or a P+ type semiconductor material. The memory 16 and the top electrode 18 produce a self-rectified property.

According to the embodiment, examples of the memory 16 include, but not limited to, WSiOx (or WxSiyOz, WSixOy), CoxSiyOz, NixSiyOz, WOx, TiOx, NiOx, AlOx, CuOx, ZrOx, NbOx, TaOx, TiNO, and other suitable materials. In practical applications, if N+ type semiconductor material is selected for making the top electrode 18, material with P type behavior may be but not limitedly adopted for making the memory 16; if P+ type semiconductor material is selected for making the top electrode 18, material with N type behavior may be but not limitedly adopted for making the memory 16. Combination of the top electrode 18 and the memory 16 produce the self-rectified property.

According to the embodiment, only the semiconductor material with strong concentration could be adopted for making the top electrode 18. In one embodiment, a P+ concentration of the material is ranging from about $10^{18}$ cm$^{-3}$ to about $10^{21}$ cm$^{-3}$, while a P− concentration is ranging from about $10^{12}$ cm$^{-3}$ to about $10^{15}$ cm$^{-3}$ and a P concentration is ranging from about $10^{15}$ cm$^{-3}$ to about $10^{18}$ cm$^{-3}$. If the concentration of the top electrode 18 is too low, then the device cannot perform the function of self-rectification. In one embodiment, the memory 16 comprises material such as WSixOy with N type behavior, while the top electrode 18 comprises the P+ type semiconductor material such as P+ Poly with a P+ concentration above $10^{18}$ cm$^{-3}$, such as from about $10^{18}$ cm$^{-3}$ to about $10^{23}$ cm$^{-3}$, or from about $10^{18}$ cm$^{-3}$ to about $10^{21}$ cm$^{-3}$.

The bottom electrode 12 of the embodiment is made from a conductive material, such as metal or semiconductor material. Metals for making the bottom electrode 12 could be Yb, Tb, Y, La, Sc, Hf, Zr, Al, Ta, Ti, Nb, Cr, V, Zn, W, Mo, Cu, Re, Ru, Co, Ni, Rh, Pd, Pt, but the disclosure is not limited thereto. In one embodiment, the bottom electrode 12 could be a layer of tungsten silicide (WSix) deposited on a semiconductor layer 11 such as N+ poly or P+ poly for preventing peeling of WSix. Moreover, another layer of WSix 19 could be formed on the P+Poly (i.e. the top electrode 18) in one embodiment, for improving the structural reliability of the self-rectified device.

Figure 5A:
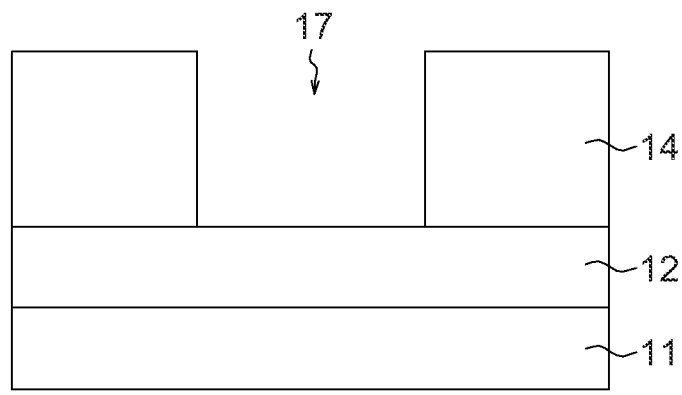
FIG. 5A~FIG. 5D illustrate a method for manufacturing a self-rectified device according to the embodiment of the disclosure.
Figure 5B:
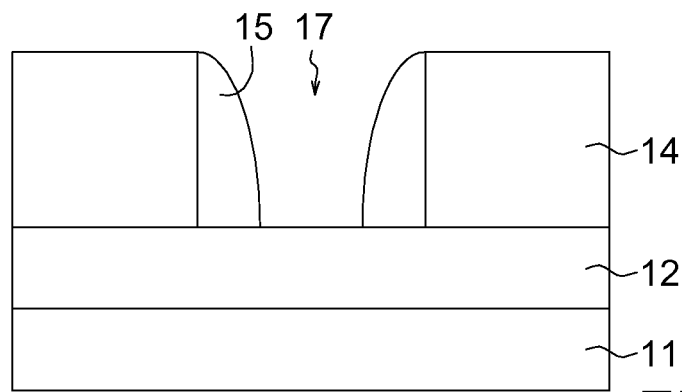

FIG. 5A~FIG. 5D illustrate a method for manufacturing a self-rectified device according to the embodiment of the disclosure. As shown in FIG. 5A, a bottom electrode 12 (for example, a layer of WSix deposited on the semiconductor layer 11 of P+ poly) is provided, and a patterned dielectric layer (such as a patterned oxide layer) 14 having a contact hole 17 is formed on the bottom electrode. The contact hole 17 exposes the bottom electrode 12. As shown in FIG. 5B, a spacer 15 is formed on the bottom electrode 12 and positioned besides the contact hole 17.

Figure 5C:
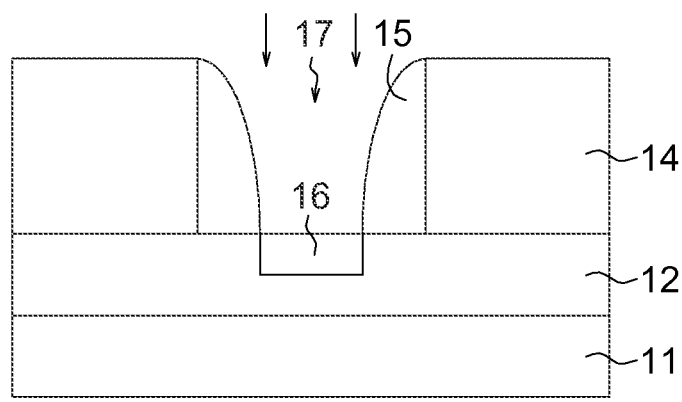

As shown in FIG. 5C, a memory 16 is formed at the bottom electrode 12 and substantially aligned with the contact hole 17 and the spacer 15. The memory area is self aligned after formation of the contact hole 17. In the embodiments, the memory 16 could be formed by subjecting the bottom electrode 12 under the contact hole 17 to an oxidation process, a down-stream plasma oxidation, an atomic layer deposition, a furnace, a rapid thermal oxidation, PVD oxide deposition, CVD oxide deposition, or chemical reaction oxidation. For example, if the bottom electrode 12 is a layer of WSix, the bottom electrode 12 under the contact hole 17 could be oxidized to form a layer of WSixOy acted as the memory 16.

In one embodiment, rapid thermal oxidation (RTO) could be used to convert the WSix into WSixOy, such as RTO with oxygen flow larger than 5 liter/min performed at a temperature of about 300° C.~800° C. (such as 350° C.) and under a pressure of about 100 torr to 1000 torr for about 10 seconds to 1000 seconds. For example, the WSix (i.e. the bottom electrode 12) under the contact hole 17 is oxidized by RTO at about 350° C. It is noted that those conditions are described for illustration, not for limitation. The steps could be adjusted or varied depending on actual needs of the practical applications.

Figure 5D:
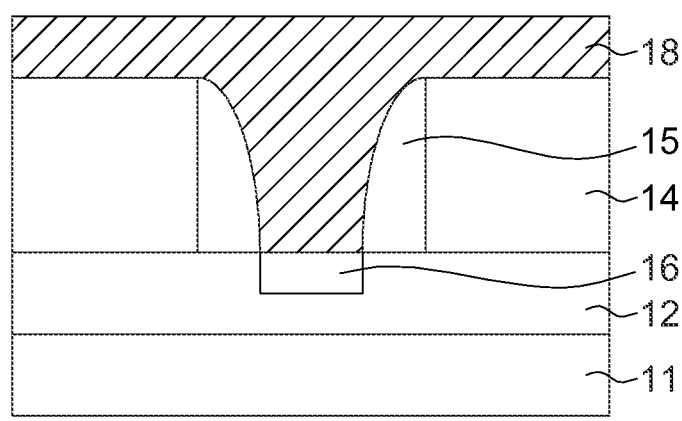

As shown in FIG. 5D, a top electrode 18 is then formed on the bottom electrode 12 and filled into the contact hole 17 to contact the memory 16. According to one of the embodiments, the memory 16 may comprise material having N type behavior while the top electrode 18 comprises a P+ type semiconductor material (ex: with a P+ concentration above $10^{18}$ cm$^{-3}$, from about $10^{18}$ cm$^{-3}$ to about $10^{23}$ cm$^{-3}$. In one embodiment, the P+ concentration is from about $10^{18}$ cm$^{-3}$ to about $10^{21}$ cm$^{-3}$); the memory 16 and the top electrode 18 produce a self-rectified property. However, it is noted that the disclosure is not limited to the memory 16 showing N type or P type behavior clearly. which is opposite to P+ or N+ material of the top electrode 18. Materials and Material selections of the memory 16 and the top electrode 18 are describe above, which are not redundantly repeated.

A self-rectified device of the embodiment with P+ poly (i.e. the top electrode 18) in contact with WSixOy (i.e. the memory 16) is exemplified, hereinafter P+ poly/WSixOy self-rectified device, and the characteristics of the self-rectified device are observed by conducting several related experiments as described below.

Figure 6:
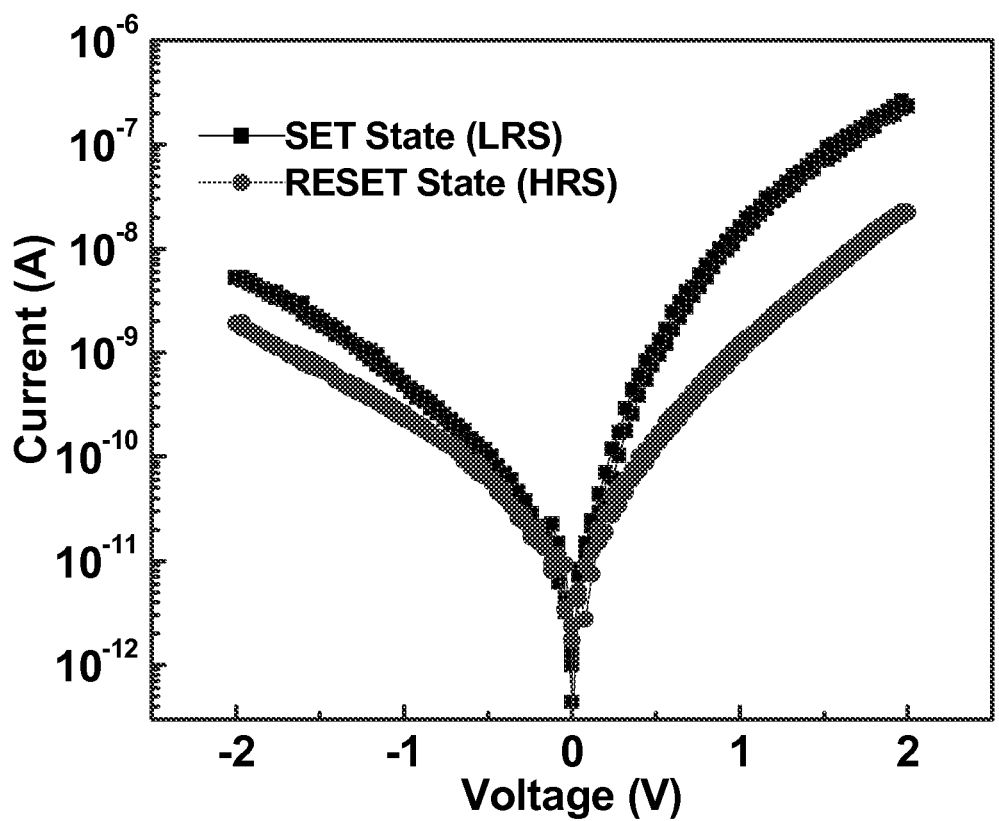
FIG. 6 shows the IV curves for the p+ poly/WSixOy self-rectified device according to the embodiment of the disclosure.

FIG. 6 shows the IV curves for the p+ poly/WSixOy self-rectified device according to the embodiment of the disclosure. In FIG. 6, when 0.5V of the forward bias is applied to the P+ poly/WSixOy self-rectified device, different currents for the SET state and RESET state are observed. However, when the P+ poly/WSixOy self-rectified device is applied with −0.5V of the reverse bias, very little current differences for the SET state and RESET state are observed. Accordingly, the SET state and RESET state of the self-rectified device of the embodiment can be distinguished in the forward current mode but is indistinguishable in the reverse current mode, because the resistance of the reverse bias dominates. This is exactly the behavior expected of a self-rectified cell of the embodiment.

Figure 7:
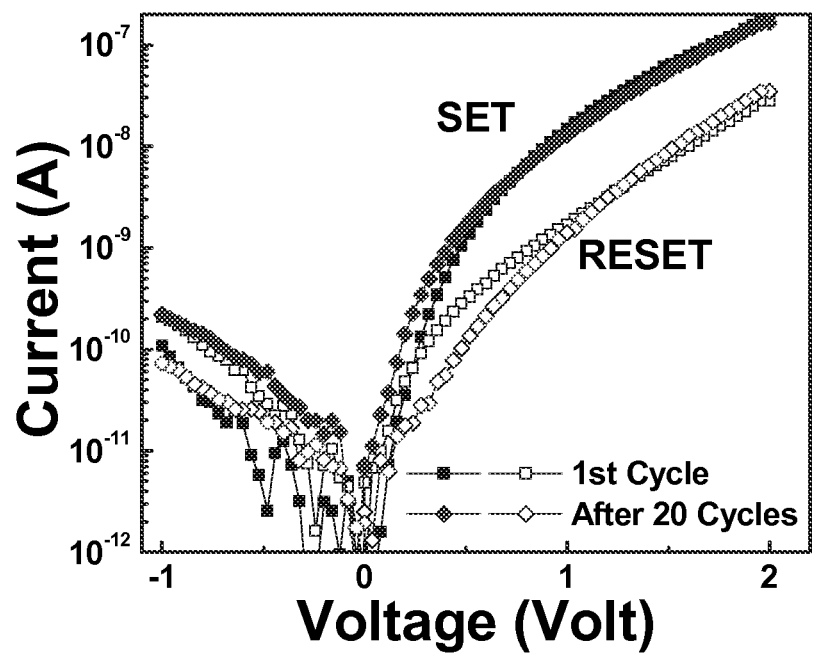
FIG. 7 shows the read I-V curves of the p+ poly/WSixOy self-rectified device according to the embodiment of the disclosure after pulse cycling test for both SET and RESET states.

FIG. 7 shows the read I-V curves of the p+ poly/WSixOy self-rectified device according to the embodiment of the disclosure after pulse cycling test for both SET and RESET states. Besides distinguishable SET/RESET states in the forward current mode and the indistinguishable SET/RESET states in the reverse current mode are observed, the self-rectifying property is well preserved after cycling, as shown in FIG. 7. Both RESET and SET states show low leakage current under reverse bias.

Figure 8:
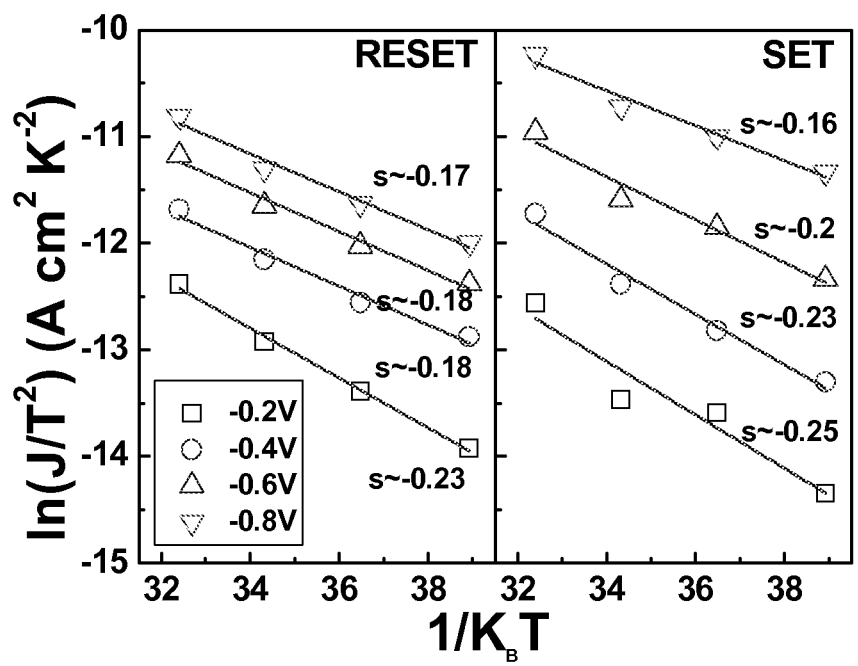
FIG. 8 shows the ln(J/T2) versus 1/kBT curves for the RESET and the SET states at various biasing voltages.
Figure 9:
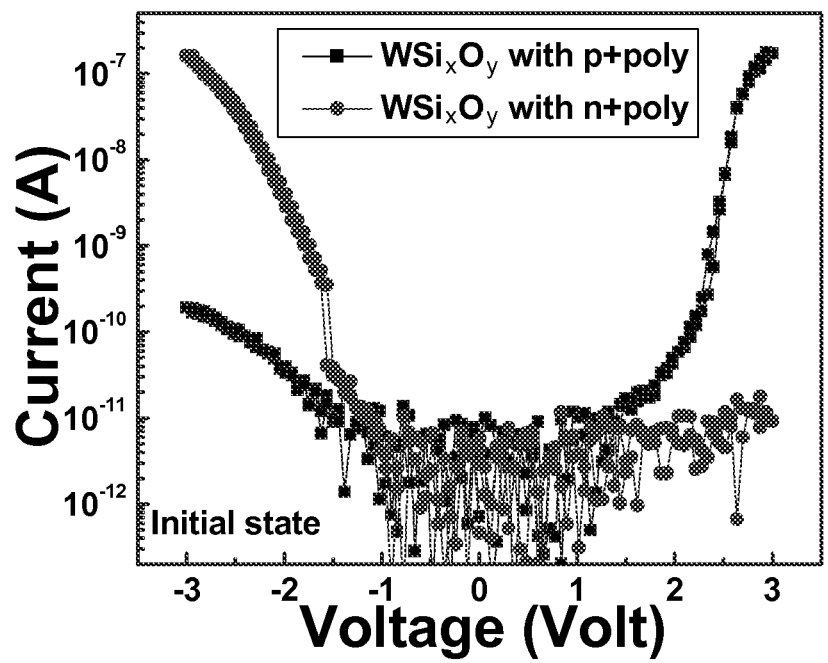
FIG. 9 shows the I-V curves and band diagrams for the P+ poly/WSixOy self-rectified device of the embodiment and the N+ poly/WSixOy device of comparison, respectively.

J-V curves at various temperatures were measured to validate the conduction mechanism. FIG. 8 shows the ln(J/T2) versus 1/kBT curves for the RESET and the SET states at various biasing voltages. As shown in FIG. 9, the ln(J/T2) vs. 1/kBT behaviors are typical for barrier lowering by the electric field in thermionic emission for both the RESET and the SET states. The barrier heights for both the RESET and SET states are similar, ~0.25 eV. This suggests that the barrier only provides the rectifying function, but the HRS and LRS still come from oxygen vacancies that are electrochemical in nature, as in most TMO ReRAM.

Also, an N+ poly/WSixOy device is provided as the comparison of the P+ poly/WSixOy self-rectified device, and the characteristics of both devices are investigated by conducting related experiments as described below.

FIG. 9 shows the I-V curves and band diagrams for the P+ poly/WSixOy self-rectified device of the embodiment and the N+ poly/WSixOy device of comparison, respectively. Negative voltage is a forward bias for the N+ poly/WSixOy device, and a reverse bias for the P+ poly/WSixOy self-rectified device. Asymmetrical I-V characteristics are observed for both N+ poly and P+ poly electrodes and may be explained by simple metal-insulator-semiconductor (MIS) phenomena. However, only the P+ poly/WSixOy self-rectified device maintains the asymmetric I-V property after the forming process. Please refer to FIG. 10, which shows a symmetric I-V curve is obtained for the N+ poly/WSixOy device, but an asymmetric I-V is obtained for P+ poly/WSixOy self-rectified device after forward forming voltage (negative for N+ poly/WSixOy and positive for P+ poly/WSixOy). The forward current is used to SET and RESET the P+ poly/WSixOy self-rectified and examine the cycling property (FIG. 7).

Application of Two-Dimensional Cross Point Array

Figure 11:
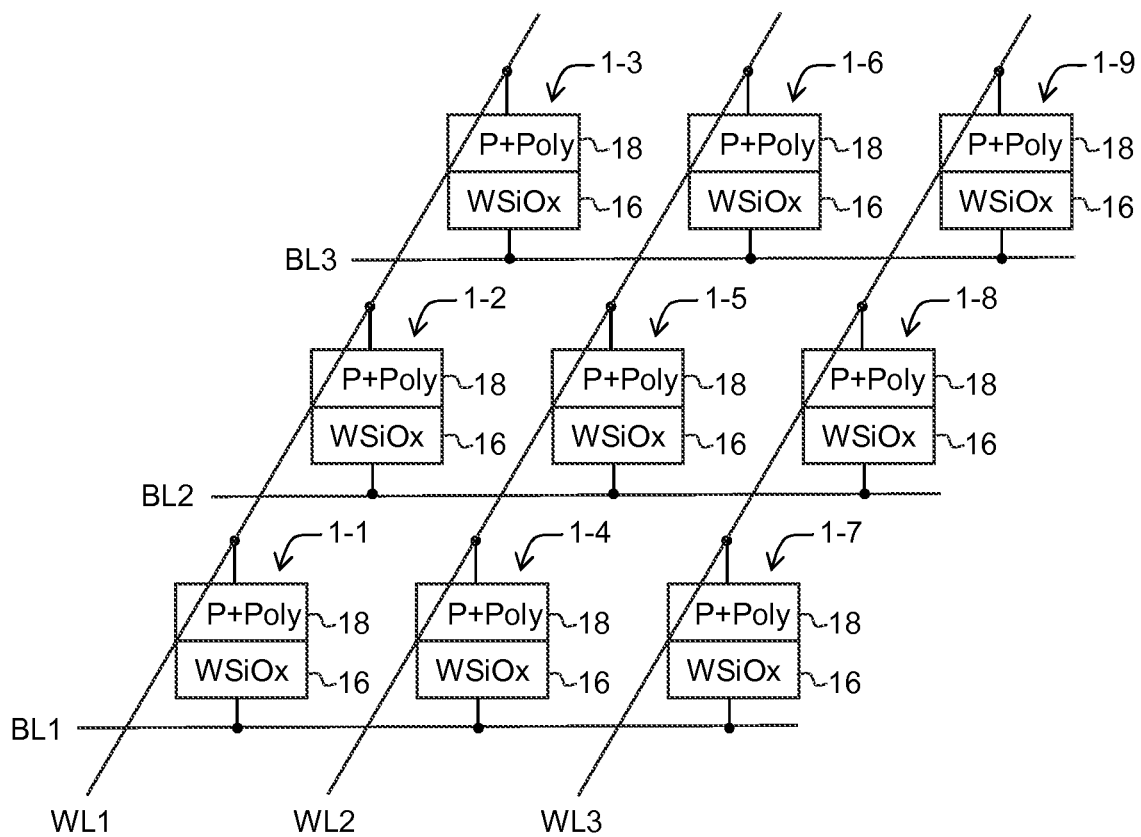
FIG. 11 illustrates a two-dimensional (2D) self-rectified array applied with the self-rectified device of the embodiment.

The self-rectified device of the embodiment could be applied to two-dimensional cross point array. FIG. 11 illustrates a two-dimensional (2D) self-rectified array applied with the self-rectified device of the embodiment. As shown in FIG. 11, the 2D self-rectified array comprises a plurality of word lines (such as WL1, WL2, WL3, . . . ) arranged substantially in parallel, a plurality of bit lines (such as BL1, BL2, BL3, . . . ) arranged substantially in parallel, and the bit lines are substantially perpendicular to the word lines. The 2D self-rectified array further comprises a plurality of self-rectified cells (ex: cells 1-1, 1-2, . . . , 1-9 in FIG. 11), and each of the self-rectified cells (1-1~1-9) connects between the corresponding one of the word lines and corresponding one of the bit lines. For example, the cell 1-1 is electrically connected to WL1 and BL1, the cell 1-2 is electrically connected to WL1 and BL2, . . . , the cell 1-9 is electrically connected to WL3 and BL3, etc.

Each of the self-rectified cells (1-1~1-9) at least comprises a top electrode 18 in contact with a memory 16. As shown in FIG. 11, the top electrode 18 of each self-rectified cell is electrically connected to the corresponding word line, and the memory 16 of each self-rectified cell is electrically connected to the corresponding bit line. Also, as described in the aforementioned descriptions, if N+ type semiconductor material is selected for making the top electrode 18, material with P type behavior may be but not limitedly adopted for making the memory 16; if P+ type semiconductor material is selected for making the top electrode 18, material with N type behavior may be but not limitedly adopted for making the memory 16; and the details of the self-rectified cells are not redundantly repeated here. The memory 16 (such as WSiOx, or denoted as WSixOy) and the top electrode 18 (such as P+ poly, with a P+ concentration above $10^{18}$ cm$^{-3}$, such as from about $10^{18}$ cm$^{-3}$ to about $10^{23}$ cm$^{-3}$. In one embodiment, the P+ concentration is from about $10^{18}$ cm$^{-3}$ to about $10^{21}$ cm$^{-3}$.) of each self-rectified cell produce a self-rectifying property as described above, and may act like a diode.

Because of the self-rectifying property of the cells (1-1~1-9), there is no need to arrange any switch (ex: transistor or diode) for the cells.

Application of Three-Dimensional (3D) Resistive Memory Structure

The self-rectified device of the embodiment could be applied to three-dimensional (3D) resistive memory structure. The 3D structure in details and relative experiments for investigate the characteristics thereof are described below.

Figure 12:
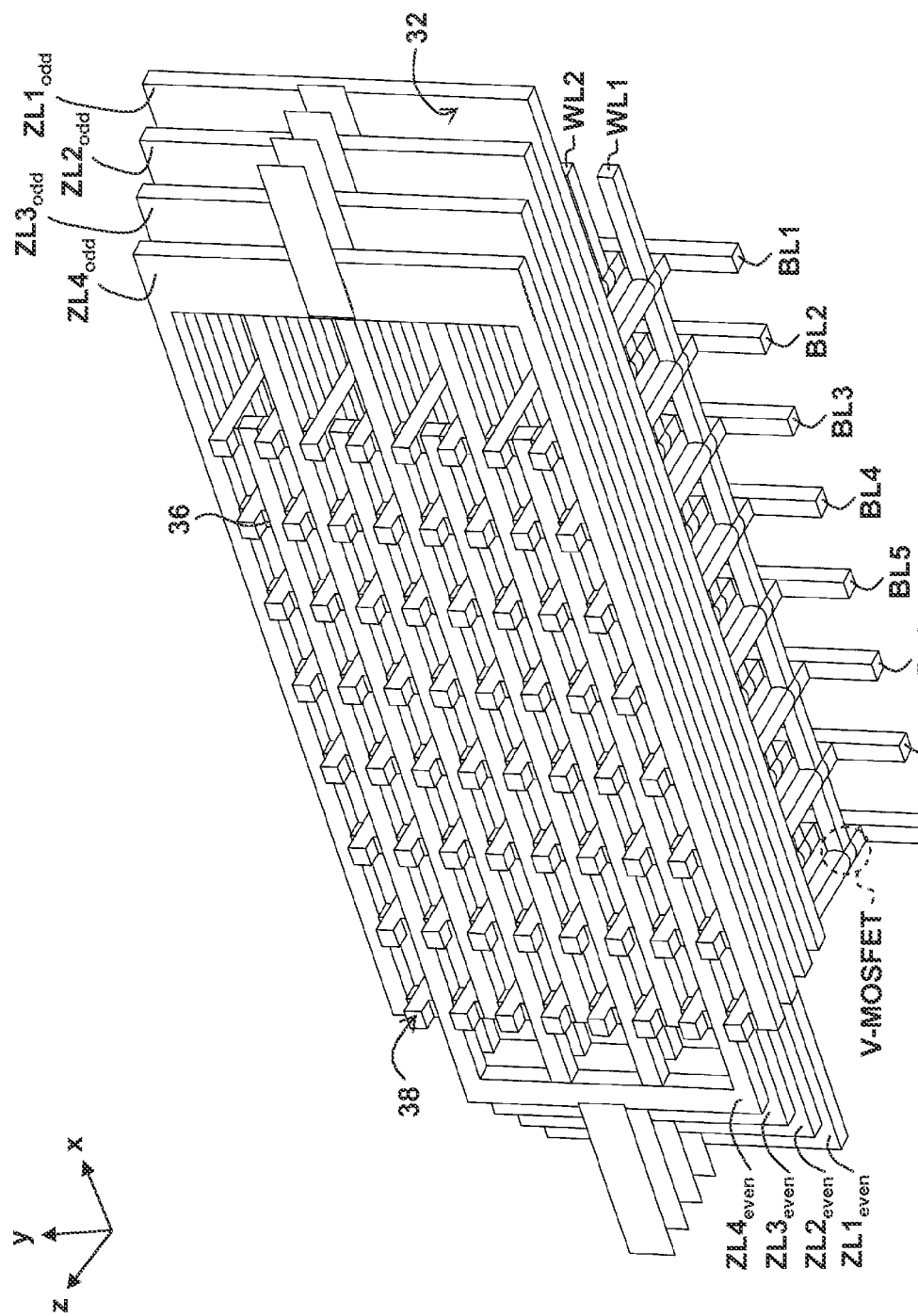
FIG. 12 illustrates a three-dimensional (3D) resistive memory structure applied with the self-rectified device of the embodiment.

FIG. 12 illustrates a three-dimensional (3D) resistive memory structure applied with the self-rectified device of the embodiment. The proposed 3D resistive memory structure comprises a plurality of word lines (such as WL1, WL2, . . . ) arranged substantially in parallel, a plurality of bit lines (such as BL1, BL2, BL3, . . . BL8) arranged substantially in parallel, and the bit lines are perpendicular to the word lines. The bit lines and the word lines extend in the x-y plane, as shown in FIG. 12. The 3D resistive memory structure further comprises a plurality of electrodes 38 and memory devices 36. The electrodes 38 are arranged in parallel and extended in a vertical direction (i.e. z-direction) to the bit lines and the word lines. Also, the electrodes 38 are electrically connected to the bit lines and the word lines correspondingly. The intersection of each electrode 38 and the corresponding word line forms a vertical MOSFET (V-MOSFET). Each of the memory devices 36 is formed on each sidewall of the electrodes 38, resulting in two devices per unit cell area. Similarly, the electrode 38 comprising N+ type or P+ type semiconductor material, wherein the memory device 36 and the electrode 38 produce a self-rectified property. In one example, a P+ type semiconductor material is selected for making the electrode 38, wherein a P+ type semiconductor material has a P+ concentration above $10^{18}$ cm$^{-3}$, such as from about $10^{18}$ cm$^{-3}$ to about $10^{23}$ cm$^{-3}$. In one embodiment, the P+ concentration is from about $10^{18}$ cm$^{-3}$ to about $10^{21}$ cm$^{-3}$. The memory device 36 and the electrode 38 function as a diode. A self-rectifying property is produced by the contact between the memory devices (such as WSiOx, or denoted as WSixOy) 36 and the electrodes 38 (such as P+ poly).

Figure 10:
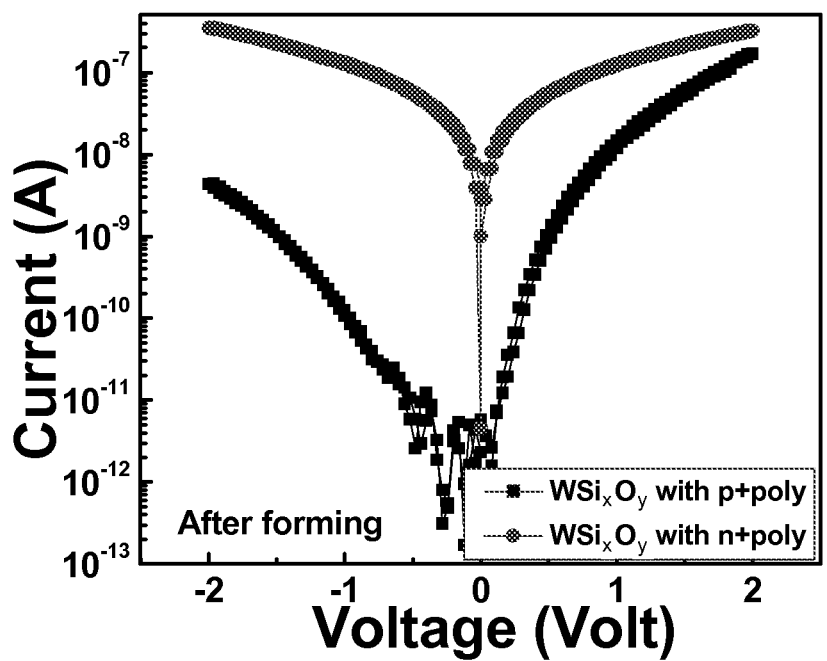
FIG. 10 shows a symmetric I-V curve obtained for the N+ poly/WSixOy device, but an asymmetric I-V obtained for P+ poly/WSixOy self-rectified device after forward forming voltage.

According to the proposed 3D resistive memory structure with the electrode (such as P+ poly, with a P+ concentration above $10^{18}$ cm$^{-3}$, from about $10^{18}$ cm$^{-3}$ to about $10^{23}$ cm$^{-3}$. In one embodiment, the P+ concentration is from about $10^{18}$ cm$^{-3}$ to about $10^{21}$ cm$^{-3}$) and the sidewall resistance memory (such as WSixOy. As the memory device 36), the electrodes 38 are extended in vertical direction, and each of the memory devices 36 is formed on each side of the electrode 38, resulting in two devices per unit cell area. The word lines and bit lines are used to select the transistor (ex: V-MOSFET) which defines the X-Y coordinate of the electrode 38, while the patterned Z-layers (such as ZL1$_{odd}$, ZL2$_{odd}$, ZL3$_{odd}$, ZL4$_{odd}$, ZL1$_{even}$, ZL2$_{even}$, ZL3$_{even}$ and ZL4$_{even}$) are used to define Z coordinate of the 3D resistive memory structure. For example, cell A in FIG. 10 is selected by WL2, BL1 and ZL4$_{odd}$; cell B in FIG. 10 is selected by WL1, BL2 and ZL4$_{even}$. The patterned Z-layers could be made of WSix. In one of the fabrication, the WSix layers are patterned by lithography/etching and serve as both the memory elements (the oxidized ends) and the interconnects (since except in the small open areas the rest of the WSix is not oxidized) to memory cells. The electrode 38 (ex. formed by P+ poly) that is connected to the drain side of an access transistor, which controls and isolates 2N ReRAM elements in the N-layer structure. Since the cell such as P+ poly/WSixOy cell is self-rectifying, no other selecting device is needed.

Figure 13A:
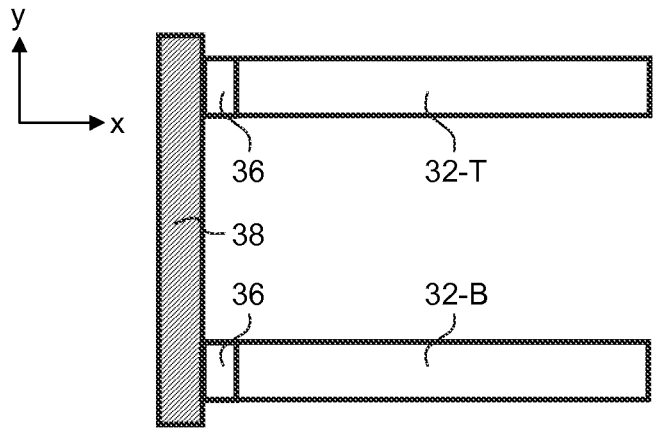
FIG. 13A illustrates parts of the three-dimensional (3D) 2-layer resistive memory structure applied with the self-rectified device of the embodiment.
Figure 13B:
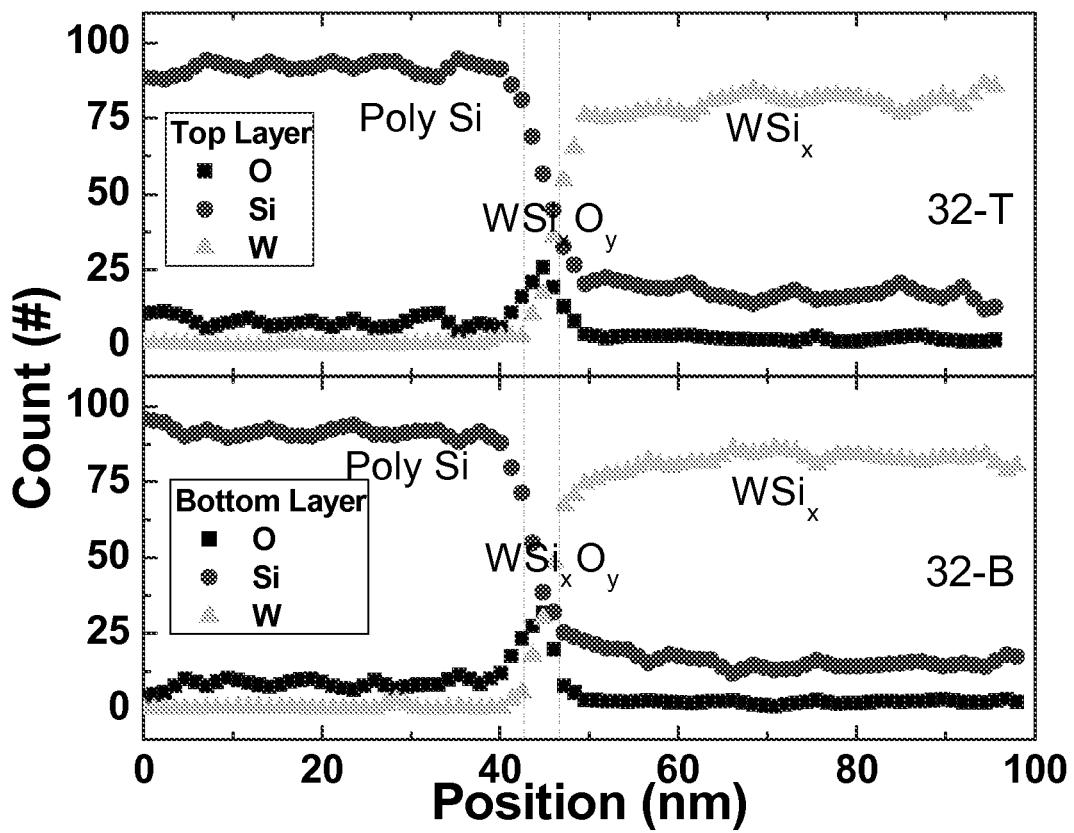
FIG. 13B presents EDX analysis for a 2-layer stack of P+Poly/WSixOy structure.

FIG. 13A illustrates parts of the three-dimensional (3D) 2-layer resistive memory structure applied with the self-rectified device of the embodiment. As shown in FIG. 13A, only parts of a top layer 32-T, a bottom layer 32-B (i.e. 2-layer structure), an electrode 38 (such as P+ Poly, with a P+ concentration above $10^{18}$ cm$^{-3}$, such as from about $10^{18}$ cm$^{-3}$ to about $10^{23}$ cm$^{-3}$. In one embodiment, the P+ concentration is from about $10^{18}$ cm$^{-3}$ to about $10^{21}$ cm$^{-3}$) vertically contact the memory devices 36 (the oxidized ends of the top layer 32-T and the bottom layer 32-B, such as WSixOy) are depicted. In one experiment, the thickness of oxidation (for being the memory devices 36, at both top layer 32-T and bottom layer 32-B) from the TEM image (not shown) is, but not limited to, about 40 Å. Please refer FIG. 13A and FIG. 13B. FIG. 13B presents EDX analysis for a 2-layer stack of P+ Poly/WSixOy structure. FIG. 13B shows good uniformity of the sidewall WSixOy film for the both top layer 32-T and the bottom layer 32-B.

Read Margin Evaluation for 3D Resistive Memory Structure

Figure 14:
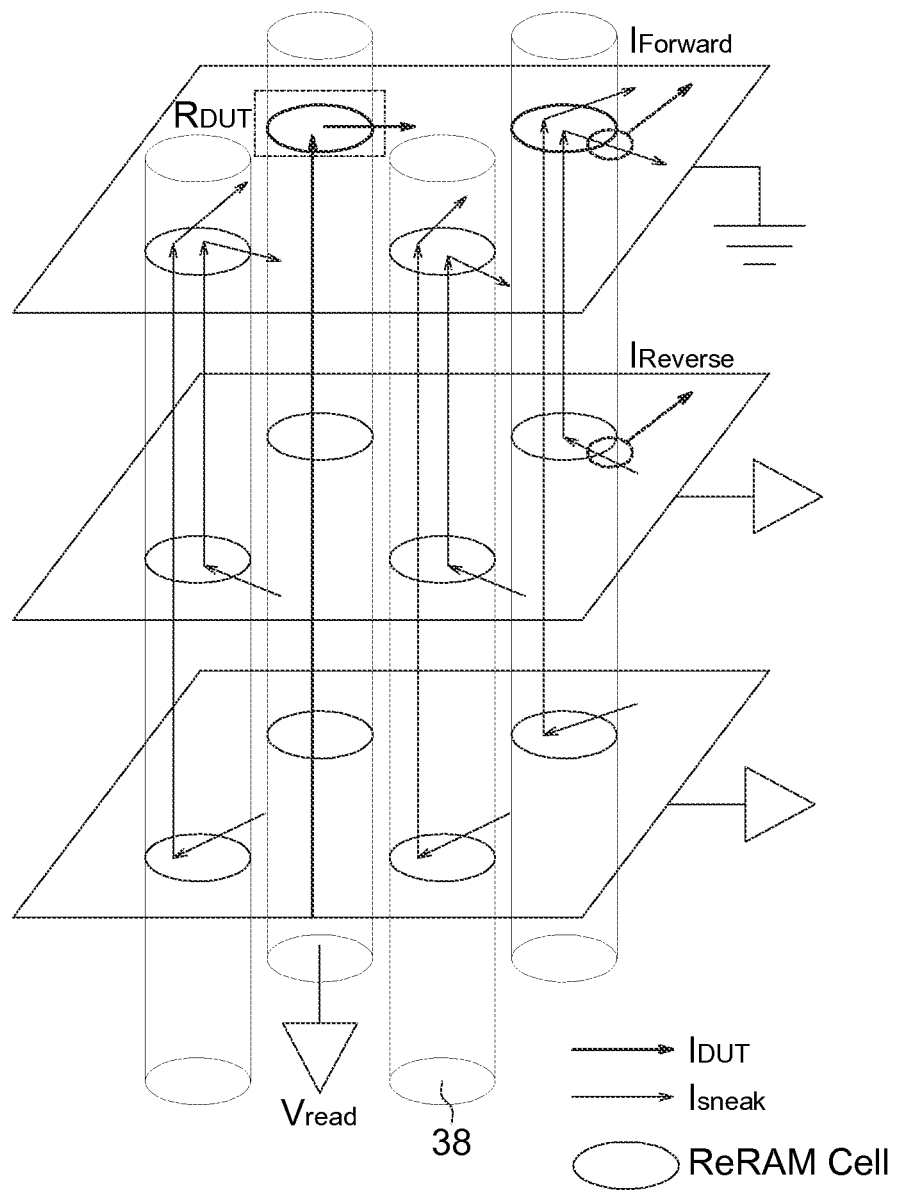
FIG. 14 illustrates the proposed ⅓ Vread scheme for a simple 2*2*3 array (i.e. 2 of word lines, 2 of bit lines and three of Z layers).

Even though the X-Y decoding is controller by a MOSFET, there are still other leakage paths within each Z plane, and between planes. These need to be isolated by the self-rectifying device. FIG. 14 illustrates the proposed ⅓ Vread scheme for a simple 2*2*3 array (i.e. 2 of word lines, 2 of bit lines and three of Z layers). The selected electrode 38 is applied a reading bias Vread while the unselected electrodes 38 are floating. The selected Z layer is grounded and ⅓ Vread is applied to all unselected Z layers. Thus, all unselected devices in the unselected electrodes are reverse biased, and only the selected device is forward biased. This allows the reading of the resistance state of the selected device.

Figure 15:
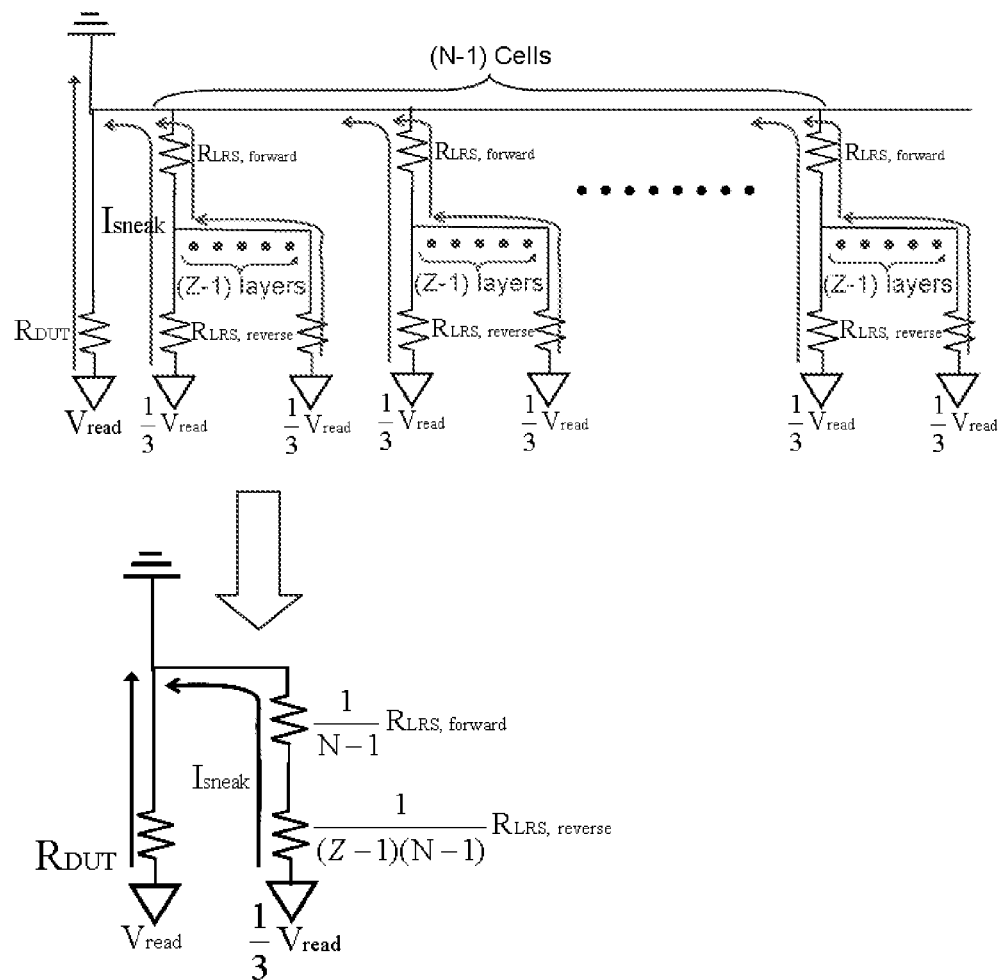
FIG. 15 illustrates the sneak leakage paths and the calculation of the read margin.

FIG. 15 illustrates the sneak leakage paths and the calculation of the read margin. Each sneak path goes through two types of memory cells, one reverse biased and one forward biased. The reverse biased cell blocks the leakage current. In the worst case, all adjacent cells are at low resistance state (LRS) and the DUT is at high resistance state (HRS), and the read margins are conservatively estimated using the worst-case scenario.

$$R_{sneak} = \frac{R_{LRS,reverse}}{(Z-1)(N-1)} + \frac{R_{LRS,forward}}{(N-1)},$$

Wherein N is the cell number of a plane, and Z is the layer number. Also, the self-rectification, SR, is represented as $R_{LRS,reverse}/R_{HRS,forward}$.

Figure 16:
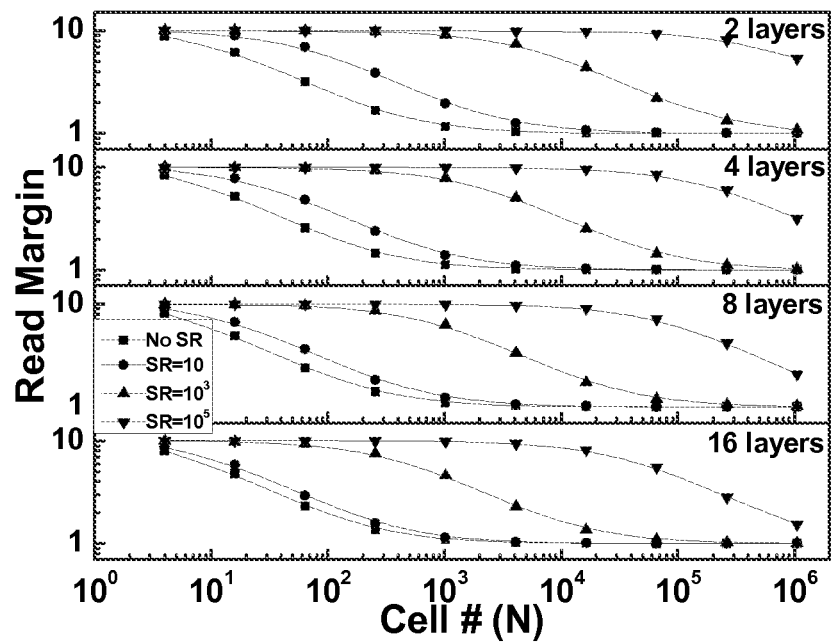
FIG. 16 shows read margin calculation with fixed resistance window of 10× (HRS/LRS) for various vertical layers.
Figure 17:
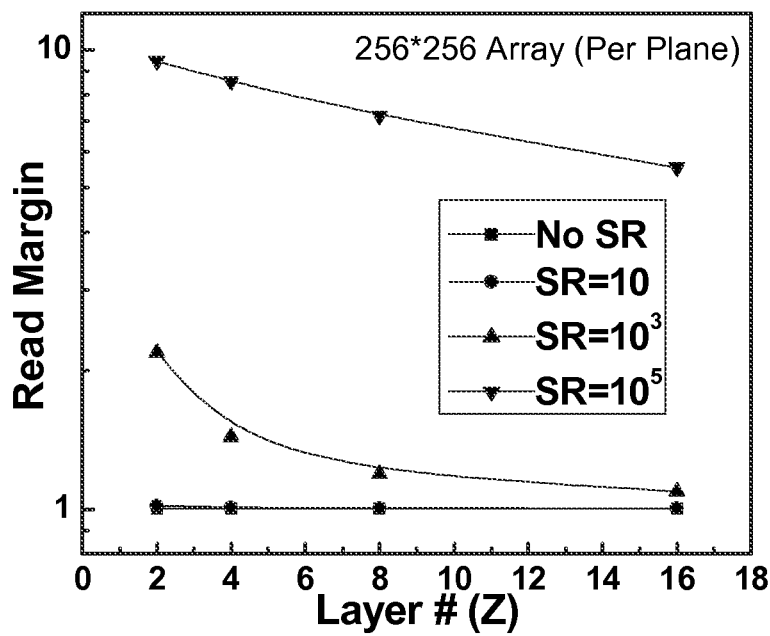
FIG. 17 shows read margin calculation for a 256*256 tile per plane for various layer numbers.

FIG. 16 and FIG. 17 show the calculated read margins for various numbers of Z-layer of the 3D resistive memory structure. FIG. 16 shows read margin calculation with fixed resistance window of 10× (HRS/LRS) for various vertical layers. The self-rectification, SR=$R_{LRS,reverse}/R_{HRS,forward}$, is a critical parameter that determines the effectiveness of blocking the sneak leakage paths, thereby determining the feasible array size. FIG. 17 shows read margin calculation for a 256*256 tile plane for various layer numbers. $10^5$ of SR is needed for 1 Mb tile size. With $10^5$ of SR, 16 layers could be adopted for constructing a possible 3D structure for a memory block of 1 Mb.

It is noted that the structures and manufacturing methods as described above are provided for illustration, and people who known in the art could adjust and modify the structures and steps based on the knowledge or the steps above. The disclosure is not limited to the structures and steps as disclosed above, and the exemplified structures and steps could be adjusted and changed based on the actual needs of the practical applications. Typically, the 3D stacked ReRAM is difficult to realize because of the difficulties in bipolar selecting device and lack of suitable architecture to decode the 2-terminal device for 3D. According to the embodiment of the disclosure, a novel self-rectified (such as a WSixOy ReRAM using p+ poly as the top electrode) is proposed. In one of the embodiment, oxidation (such as RTO) of WSix forms both the WSixOy storage node and a rectifying device with the p+ poly electrode. The simple method for manufacturing the self-rectified device of the embodiment allows it to incorporate into a double-density 3D architecture that adopts a regular MOSFET for X-Y decoding. It is estimated that this device and architecture can easily provide operation margins for up to 16 layers of 3D ReRAM.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A self-rectified device, comprising:
a bottom electrode;
a patterned dielectric layer with a contact hole formed on the bottom electrode;
a memory formed at the bottom electrode and substantially aligned with the contact hole;
a top electrode formed on the bottom electrode and filling into the contact hole to contact the memory, the top electrode comprising a N+ type semiconductor material while the memory being made from a P type behavior material, or the top electrode comprising a P+ type semiconductor material while the memory being made from a N type behavior material; and
a conductive layer directly formed on the top electrode to contact the top electrode, wherein the bottom electrode and the conductive layer both comprise a same metal silicide material;
wherein the memory and the top electrode produce a self-rectified property.

2. The self-rectified device according to claim 1, wherein the P+ type semiconductor material has a P+ concentration above $10^{18}$ cm$^{-3}$.

3. The self-rectified device according to claim 1, wherein the P+ type semiconductor material has a P+ concentration ranging from about $10^{18}$ cm$^{-3}$ to about $10^{23}$ cm$^{-3}$.

4. The self-rectified device according to claim 1, wherein the memory comprises WxSiyOz, CoxSiyOz, NixSiyOz, WOx, TiOx, NiOx, AlOx, CuOx, ZrOx, NbOx, TaOx, or TiNO.

5. The self-rectified device according to claim 1, wherein the bottom electrode is made of a conductive material, comprising metal or semiconductor.

6. The self-rectified device according to claim 1, wherein the patterned dielectric layer comprises a spacer besides the contact hole, and the memory is aligned with the contact hole and the spacer.

7. A method for manufacturing a self-rectified device, comprising:
forming a bottom electrode;
forming a patterned dielectric layer on the bottom electrode, and the patterned dielectric layer having a contact hole exposing the bottom electrode;
forming a memory at the bottom electrode, and the memory substantially aligned with the contact hole;
forming a top electrode on the bottom electrode and filling into the contact hole to contact with the memory; and
forming a conductive layer directly on the top electrode to contact the top electrode, wherein the bottom electrode and the conductive layer both comprise a same metal silicide material;
wherein the top electrode comprises a N+ type semiconductor material while the memory is made from a P type behavior material, or the top electrode comprises a P+ type semiconductor material while the memory is made from a N type behavior material, and the memory and the top electrode produce a self-rectified property.

8. The method according to claim 7, wherein the bottom electrode under the contact hole is oxidized to form the memory.

9. The method according to claim 7, wherein the memory is formed by subjecting the bottom electrode under the contact hole to an oxidation process, a down-stream plasma oxidation, an atomic layer deposition, a furnace, a rapid thermal oxidation, PVD oxide deposition, CVD oxide deposition, or chemical reaction oxidation.

10. The method according to claim 7, wherein the memory comprises WxSiyOz, CoxSiyOz, NixSiyOz, WOx, TiOx, NiOx, AlOx, CuOx, ZrOx, NbOx, TaOx, or TiNO.

11. A three-dimensional (3D) resistive memory structure, comprising:
a plurality of word lines arranged substantially in parallel;
a plurality of bit lines arranged substantially in parallel, and the bit lines substantially perpendicular to the word lines;
a plurality of electrodes arranged in parallel and extended in a vertical direction to the bit lines and the word lines, and the electrodes electrically connected to the bit lines and the word lines correspondingly, wherein each of the electrodes comprises a top electrode and a conductive layer directly formed on the top electrode to contact the top electrode; and
a plurality of memory devices, and each of the memory devices comprising a bottom electrode and a memory element formed on the bottom electrode, wherein each of the memory devices are formed on each sidewall of the electrodes, resulting in two memory devices of each self-rectified cell,
wherein each of the bottom electrodes and each of the conductive layers comprise a same metal silicide material, and each of the electrode comprises an N+ type semiconductor material while each of the memory elements is made from a P type behavior material, or each of the electrode comprises a P+ type semiconductor material while the memory elements is made from a N type behavior material, and a self-rectifying property is produced by the contact between the memory device and the electrode.

12. The three-dimensional resistive memory structure according to claim 11, wherein each electrode is connected to a drain side of an access transistor.

13. The three-dimensional resistive memory structure according to claim 11, wherein the P+ type semiconductor material has a P+ concentration above $10^{18}$ cm$^{-3}$.

14. The three-dimensional resistive memory structure according to claim 11, wherein the P+ type semiconductor material has a P+ concentration ranging from about $10^{18}$ cm$^{-3}$ to about $10^{23}$ cm$^{-3}$.

15. A memory device, comprising:
a bottom electrode;
a memory element on the bottom electrode, the memory element being oxide of the bottom electrode;
a doped poly-silicon layer on the memory element; and
a conductive layer directly formed on the doped poly-silicon layer to contact the doped poly-silicon layer,
wherein the bottom electrode and the conductive layer both comprise a same metal silicide material, and the memory element is made from a P type behavior material when the doped poly-silicon layer is an N+ type polysilicon, or the memory element is made from a N type behavior material when the doped poly-silicon layer is an P+ type polysilicon.

16. The memory device according to claim 15, further comprising a spacer vertically disposed above the memory element, wherein a portion of the doped poly-silicon layer and the memory element are vertically aligned by the spacer.

17. The memory device according to claim 15, wherein the doped poly-silicon layer contain P+ or N+ concentration above $10^{18}$ cm$^{-3}$.

18. The memory device according to claim 15, wherein the doped poly-silicon layer contain P+ or N+ concentration ranging from about $10^{18}$ cm$^{-3}$ to about $10^{23}$ cm$^{-3}$.

19. The memory device according to claim 15, wherein the doped poly-silicon layer contacts the memory element.

20. A method of reading a memory cell of a 3D memory device, comprising:
applying a voltage to a selected electrode, wherein the selected electrode comprises a top electrode and a conductive layer directly formed on the top electrode to contact the top electrode;
grounding a selected layer which is perpendicular to the selected electrode;
applying one third of the voltage to unelected layers; and
sensing the memory cell located in a crossover of the selected electrode and the selected layer, and the memory cell comprising a memory element formed on a bottom electrode and contacting the selected electrode, wherein the bottom electrode and the conductive layer both comprise a same metal silicide material;
wherein the memory element is made from a P type behavior material when the selected electrode comprises an N+ type semiconductor material, or the memory element is made from a N type behavior material when the selected electrode comprises an P+ type semiconductor material.

21. The method according to claim 20, further comprising floating unselected electrodes while the voltage is applied to the selected electrode.

22. The method according to claim 20, wherein the memory cell is located in the intersection of the selected electrode and the selected layer as a selected memory cell.

23. The method according to claim 22, wherein the selected memory cell is forward biased and all unselected memory cells in unselected electrodes are reverse biased, which allows the reading of a resistance state of the selected memory cell.

* * * * *